United States Patent [19]

Miyamori

[11] 4,336,510

[45] Jun. 22, 1982

[54] OSCILLATOR WITH A FEEDBACK CIRCUIT EMPLOYING A PRE-POLARIZED CERAMIC PIEZOELECTRIC OSCILLATING UNIT

[75] Inventor: Masashige Miyamori, Hakui, Japan

[73] Assignee: Murata Manufacturing Co., Ltd., Japan

[21] Appl. No.: 109,284

[22] Filed: Jan. 3, 1980

[30] Foreign Application Priority Data

Jan. 11, 1979 [JP] Japan ................................. 54/2494

[51] Int. Cl.$^3$ .............................................. H03B 5/32
[52] U.S. Cl. ................................... 331/163; 310/357; 310/366
[58] Field of Search ........................ 331/116 FE, 163; 368/159; 310/357, 366

[56] References Cited

U.S. PATENT DOCUMENTS

| 2,969,512 | 1/1961 | Jaffe et al. ...................... 310/366 X |
| 3,432,773 | 3/1969 | Land et al. ........................... 331/163 |
| 4,066,986 | 1/1978 | Takano et al. .................. 310/366 X |
| 4,109,456 | 8/1978 | Yamada et al. ...................... 331/163 |

FOREIGN PATENT DOCUMENTS

863680 1/1953 Fed. Rep. of Germany ...... 331/163

OTHER PUBLICATIONS

J. P. Buchanan, "Handbook of Piezoelectric Crystals for Radio Equipment Designers", Wright Air Development Center Report 54-248, Dec. 1954, pp. 222-223.

*Primary Examiner*—Siegfried H. Grimm
*Assistant Examiner*—Edward P. Westin
*Attorney, Agent, or Firm*—Ostrolenk, Faber, Gerb & Soffen

[57] ABSTRACT

A feedback circuit for use in an oscillator has a piezoelectric oscillating unit constituted by a square plate-like piezoelectric body, first and second electrodes provided on one surface of the piezoelectric body and a common electrode provided on the other surface of the piezoelectric body. The piezoelectric body is polarized in one direction between the first and common electrodes and in the opposite direction between the second and common electrodes.

10 Claims, 13 Drawing Figures

OSCILLATOR WITH A FEEDBACK CIRCUIT EMPLOYING A PRE-POLARIZED CERAMIC PIEZOELECTRIC OSCILLATING UNIT

BACKGROUND OF THE INVENTION

The present invention relates to an oscillator and, more particularly, to a feedback circuit for use in the oscillator employing a piezoelectric oscillating unit.

Generally, the oscillator includes, as shown in FIG. 1, an amplifier A having a gain greater than 1 and a feedback circuit F connected between the output and input of the amplifier A. The signal produced from the output of the amplifier A is partly fedback to the input of the amplifier A for producing oscillating signal from the amplifier A.

Recently, various types of digital devices employ a clock-pulse producing circuit which uses an oscillator employing a piezoelectric oscillating unit. However, in the oscillator of the prior art, the feedback circuit includes capacitors other than the piezoelectric oscillating unit. For example, in FIG. 2, the feedback circuit F of the prior art includes a piezoelectric oscillating unit x having two electrodes 2 and 3, a capacitor C1 connected between the electrode 2 and the ground, and a capacitor C2 connected between the electrode 3 and the ground. The output of the amplifier A is connected to the electrode 3 through an input terminal 4 while the input of the amplifier A is connected to the electrode 2 through an output terminal 5. The feedback circuit F is so arranged as to cause the piezoelectric oscillating unit x to exhibit an inductive property in the frequency region between resonant frequency fr and antiresonant frequency fa. FIG. 3 shows an equivalent circuit under the operating condition of the feedback circuit F forming a Colpitts oscillator together with the amplifier A. The equivalent circuit includes resistance component Re and inductance component L which corresponds to the resistance and inductance of the piezoelectric oscillating unit produced during the oscillation of the piezoelectric oscillating unit. The resistance component Re and the inductance component L are connected in series between the input and output terminals 4 and 5. A capacitance component C1' is connected between the output terminal 5 and the ground while a capacitance component C2' is connected between the input terminal 4 and the ground. The capacitance component C1' has a capacitance equal to the sum of capacitance C1 (the reference characters used for indicating electric elements are also used for indicating their particular electrical amount) and input capacitance at the input of the amplifier A. Similarly, the capacitance component C2' has a capacitance equal to the sum of capacitance C2 and output capacitance at the output of the amplifier A.

In the above described oscillator employing a two electrode type piezoelectric oscillating unit x, it is necessary to further employ two capacitors C1 and C2.

Furthermore, the unstableness in the capacitance of the capacitors C1 and C2 causes a variation in the oscillating frequency. Therefore, in order to stabilize the oscillating frequency, it is necessary to further provide an additional electric element such as a trimmer capacitor, which results in an increased number of components and also increased manufacturing cost.

SUMMARY OF THE INVENTION

Accordingly, a primary object of the present invention is to provide a feedback circuit which is simple in construction and can readily be manufactured at low cost.

It is an important object of the present invention to provide a feedback circuit employing an improved piezoelectric oscillating unit having three electrodes provided on the piezoelectric body.

In accordance with a preferable embodiment of the invention, an oscillator having an amplifier and a feedback circuit connected between output and input of the amplifier is characterized in that the feedback circuit comprises a ceramic pre-polarized piezoelectric oscillating unit having three electrodes. More particularly, the piezoelectric oscillating unit comprises a piezoelectric body having first and second surfaces in face-to-face relation to, for example, in parallel relation to, each other. A first section of the piezoelectric body is polarized in one direction between the first and second surfaces and a second section of the piezoelectric body is polarized in the opposite direction. The piezoelectric oscillator unit further comprises first and second electrodes provided on the first surface in separate relation to each other in alignment with the first and second sections of the piezoelectric body, respectively, and first and second counter electrode means provided on the second surface and covering the first and second sections, respectively, of the piezoelectric body. An output signal produced from the output of the amplifier is provided across the first electrode and the first counter electrode means while an output signal produced across the second electrode and the second counter electrode means is provided to the input of the amplifier. In other words, the first and second electrodes are connected to the input and output of the amplifier while the common electrode is connected to the ground.

BRIEF DESCRIPTION OF THE DRAWINGS

The foregoing and other objects, features and advantages of the invention will be apparent from the following description of the invention with reference to the accompanying drawings in which:

FIG. 3 being an equivalent circuit diagram of the circuit shown in FIG. 2;

FIGS. 8(a), 8(b) and 8(c) are top, bottom and cross-sectional views of a piezoelectric oscillating unit showing a modified form;

DETAILED DESCRIPTION OF THE INVENTION

Figure 1:
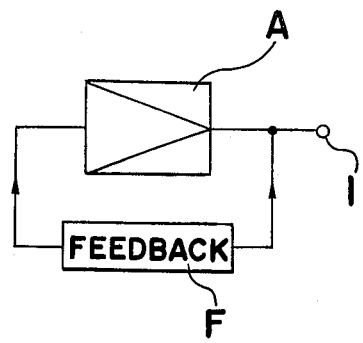
FIGS. 1, 2 and 3 illustrate the prior art referred to in the foregoing description, FIG. 1 being a block diagram of an oscillator in general, FIG. 2 being a circuit diagram of one conventional oscillator employing piezoelectric oscillating unit.

In the following description of the invention like parts are designated by like reference numerals throughout the accompanying drawings.

Figure 4:
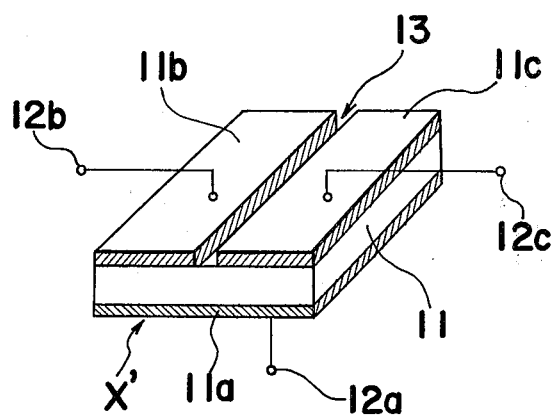
FIG. 4 is a perspective view of a piezoelectric oscillating unit employed in the oscillator of the present invention.

Referring to FIG. 4, a feedback circuit of the present invention comprises a ceramic piezoelectric oscillating unit x'. The piezoelectric oscillating unit x' is constituted by a rectangular shaped piezoelectric body 11 made of lead titanate finished through burning. The body 11 has a first or upper flat surface and a second or lower flat surface which are parallel to each other. The lower flat surface is laminated entirely with a common electrode 11a while the upper flat surface is laminated with first and second electrodes 11b and 11c which are spaced a predetermined distance from each other to provide a gap 13 therebetween. The common electrode 11a is connected to a common terminal 12a formed on a casing (not shown) for the feedback circuit while the first and second electrodes 11b and 11c are connected to output and input terminals 12b and 12c, respectively, on the casing for the feedback circuit. Since the piezoelectric oscillating unit x' has three terminals, it is generally called a three electrode type piezoelectric oscillating unit.

Figure 5:
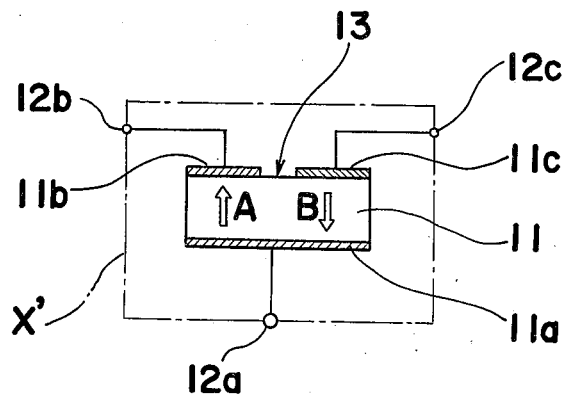
FIG. 5 is a diagrammatic view showing a manner in which the piezoelectric body is polarized.

Referring to FIG. 5, the piezoelectric body 11 is pre-polarized in such a manner that the piezoelectric body between the common electrode 11a and the first electrode 11b is polarized in a direction as shown by an arrow A, whereas the piezoelectric body between the common electrode 11a and the second electrode 11c is polarized in the opposite direction as shown by an arrow B.

The formation of two polarized properties in the opposite directions in one piezoelectric body is carried out by the application of high dc voltage in one direction between the common electrode 11a and the first electrode 11b and high dc voltage in the opposite direction between the common electrode 11a and the second electrode 11c. Alternately, it can be carried out by the application of high dc voltage between the common electrode 11a and an entirely laminated electrode on the upper surface of the body 11. Thereafter, the entirely laminated electrode is divided into two sections 11b and 11c by forming the gap 13 approximately at the center of the entirely laminated electrode. Then, dc high voltage is applied in the opposite direction to the previously provided direction, between the common electrode and one of the two sections 11b and 11c.

Figure 6:
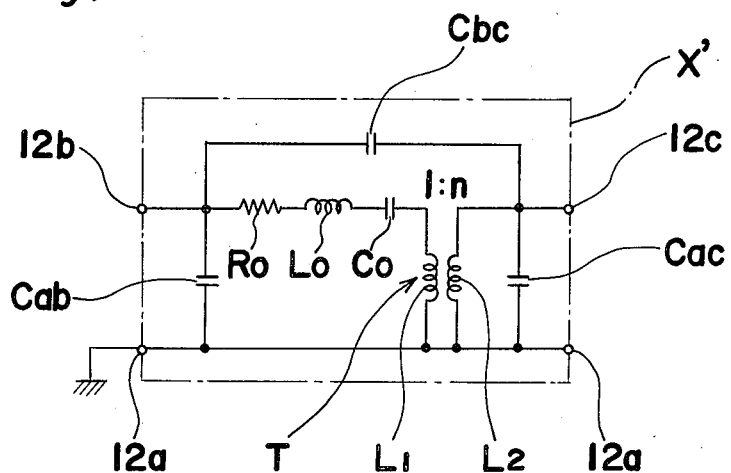
FIG. 6 is an equivalent circuit diagram of the piezoelectric oscillating unit shown in FIG. 4.

Referring to FIG. 6, an equivalent circuit of the piezoelectric oscillating unit x' is shown. The equivalent circuit includes a capacitor Cab connected between the terminals 12a and 12b, a capacitor Cac connected between the terminals 12a and 12c and a capacitor Cbc connected between the terminals 12b and 12c. The capacitor Cab has a capacitance corresponding to the electrostatic capacitance between the electrodes 11a and 11b of the unit x', the capacitor Cac has a capacitance corresponding to the electrostatic capacitance between the electrodes 11a and 11c and the capacitor Cbc has a capacitance corresponding to the electrostatic capacitance between the electrodes 11b and 11c.

The equivalent circuit further includes equivalent constants Ro, Lo and Co which are connected in series between the terminal 12b and an ideal transformer T which will be described later. These constants Ro, Lo and Co are obtained when the terminals 12a and 12c are short-circuited so that the piezoelectric oscillating unit x' can be considered as a two electrode type instead of three. The constant Ro has an equivalent resistance, the constant Lo has an equivalent mass and the constant Co has an equivalent compliance.

The ideal transformer T includes windings L1 and L2 having the winding ratio of 1:n in which the winding L1 is connected between the equivalent constant Co and the terminal 12a while the winding L2 is connected between the terminal 12c and the terminal 12a. The ratio n of the ideal transformer can be given by the following formula;

$$n^2 = Ro/R'O = Lo/L'O = C'O/Co$$

wherein R'O, L'O and C'O are equivalent constants obtained when the terminals 12a and 12b are short-circuited so that the piezoelectric oscillating unit x' can be considered as a two electrode type instead of three. In the case where the piezoelectric body 11 is polarized in one direction uniformly through the entire body, the ratio n is smaller than 0 ($n < 0$). On the other hand, when the piezoelectric body 11 has two sections polarized in the opposite directions as shown in FIG. 5, the ratio n is larger than 0 ($n > 0$).

Under the condition $n < 0$, the voltage signal across the terminals 12a and 12b has a phase opposite to the voltage signal across the terminals 12a and 12c. Whereas under the condition $n > 0$, the three electrode type piezoelectric oscillating unit x' exhibits the same phase between the voltage signal across the winding L1 and the voltage signal across the winding L2. As apparent to those skilled in the art, the capacitors Co and Cbc can be disregarded during the oscillation of the oscillating unit x'. Accordingly, the circuit shown in FIG. 6, constituted by the equivalent resistor Ro, equivalent mass Lo and capacitors Cab and Cac has the same network as the circuit shown in FIG. 3. Thus, it is understood that the three electrode type piezoelectric oscillating unit x' has a frequency which is equivalent to the circuit shown in FIG. 3.

Figure 2:
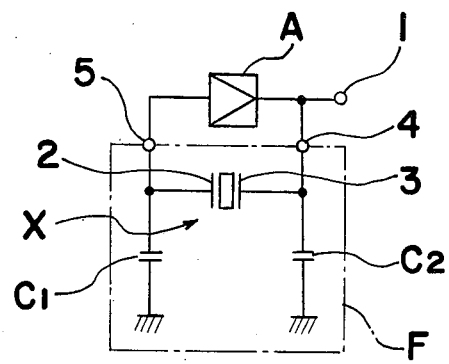

In the above case, since the capacitor Cab corresponds to the capacitor C1 and the capacitor Cac corresponds to the capacitor C2, it is possible to consider the capacitors Cab and Cac as the capacitors C1 and C2 in the feedback circuit of the prior art shown in FIG. 2. In other words, in the case where the three electrode type piezoelectric oscillating unit x' is employed in the feedback circuit, it is not necessary to provide additional capacitors C1 and C2.

Figure 7:
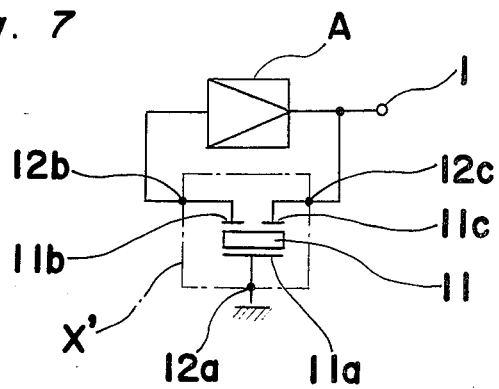
FIG. 7 is a circuit diagram showing connection between the amplifier and the piezoelectric oscillating unit shown in FIG. 4.

Referring to FIG. 7, an oscillator employing the feedback circuit of the present invention is shown. The terminals 12b and 12c are connected to input and output terminals of the amplifier A while the terminal 12a is connected to the ground.

In this arrangement, so long as the oscillating unit x' is formed within a set tolerance, the equivalent capacitances Cab and Cac will be within the set tolerance. Therefore, the oscillating frequency is considerably stable and thus there is no need to adjust the oscillating frequency.

It is to be noted that the terminals 12b and 12c which have been described as connected to the input and output of the amplifier A can be connected to output and input of the amplifier A.

Furthermore, in the above arrangement, it is not necessary to provide additional lumped impedance matching capacitors between terminals 12a and 12b and between terminals 12a and 12c so long as the amplifier A is not a current amplifying type which requires a lower input impedance than that obtained by the oscillating unit x′ only. In other words, in the case where the amplifier A is a current amplifying type, it may be necessary to provide additional lumped capacitors for the impedance matching. However, in the case where the amplifier A is a voltage amplifying type as often used in metal-oxide semiconductor type integrated circuit (MOS type IC), the oscillating unit x′ can be directly connected to the amplifier A without any additional impedance matching capacitors, since the oscillating unit x′ can be so arranged as to have a sufficiently high impedance for the impedance matching with the voltage amplifier A which has a comparatively high input impedance. The above mentioned arrangement of the oscillating unit x′ can be formed by changing the size of the laminated electrodes 11b and 11c in terms of their respective areas preoccupied on the piezoelectric body.

Although the primary object of the present invention is to provide a feedback circuit employing three electrode type piezoelectric oscillating unit, this structure results in such an advantage that additional impedance matching capacitors can be eliminated when a voltage amplifier is used. Therefore, the oscillator employing the feedback circuit of the present invention is particularly suitable for use in a clock generator incorporated in a one chip microcomputer constituted by MOS type large scale integrated circuit (LSI). In this case, it is not necessary to provide any additional capacitors corresponding to C1 and C2, nor impedance matching capacitors, as in the prior art.

Next, modifications of the piezoelectric oscillating unit x′ are described.

Figure 8B:
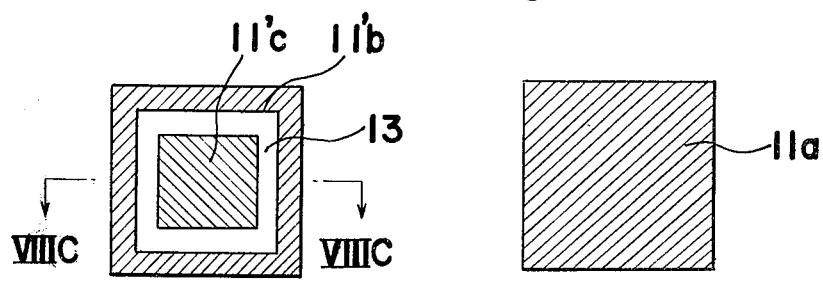
Figure 8C:
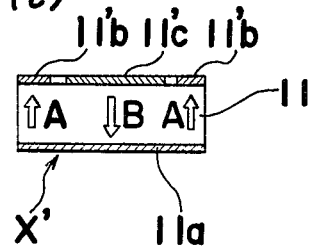

Referring to FIGS. 8(a) to 8(c), the piezoelectric oscillating unit x′ in this modification includes a square piezoelectric body having upper and lower flat surfaces. The upper surface is provided with two electrodes, as best shown in FIG. 8(a), one electrode, namely rim electrode 11b′, being laminated on the peripheral edge portion of the upper surface, while the other electrode, namely center electrode 11c′, is laminated on the central portion of the upper surface. The lower surface is provided with common electrode 11a entirely on the lower surface as shown in FIG. 8(b). The rim electrode 11b′ and the central electrode 11c′ are separated a predetermined distance from each other. FIG. 8(c) shows the direction of polarization in the piezoelectric body.

It is to be noted that the piezoelectric body which has been described as square-shaped may be of a circular shape.

Figure 9:
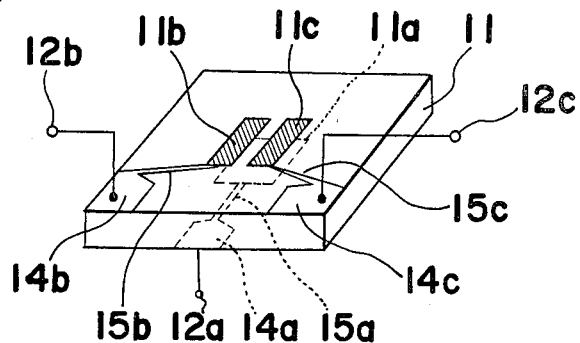
FIG. 9 is a perspective view of a piezoelectric oscillating unit showing a further modified form.

Referring to FIG. 9, the piezoelectric oscillating unit x′ in this modification is an energy trapped three electrode type and includes a square piezoelectric body having upper and lower surfaces. The upper surface is provided with two electrodes 11b and 11c which are small in size when compared with the area of the upper surface and two terminal electrodes 14b and 14c each laminated at a corner edge portion of the upper surface. The electrodes 11b and 11c are connected with the terminal electrodes 14b and 14c, respectively, through runner electrodes 15b and 15c. The lower surface is provided with common electrode 11a which is also comparatively small in size and positioned in face-to-face relation with the electrodes 11b and 11c and a terminal electrode 14a positioned on the peripheral portion of the lower surface. The common electrode 11a and the terminal electrode 14a are connected to each other through a runner electrode 15a. It is to be noted that the terminal electrode 14a and the runner electrode 15a are not in face-to-face relation with any electrodes laminated on the upper surface. The terminal electrode 14a is connected to the terminal 12a while the terminal electrodes 14b and 14c are connected to the terminals 12b and 12c, respectively. The piezoelectric body is polarized in such a manner that the body section positioned between the electrodes 11b and 11a is polarized in one direction, for example, from lower surface to upper surface, while the body section positioned between the electrodes 11c and 11a is polarized in the opposite direction, for example, from upper surface to lower surface.

Figure 3:
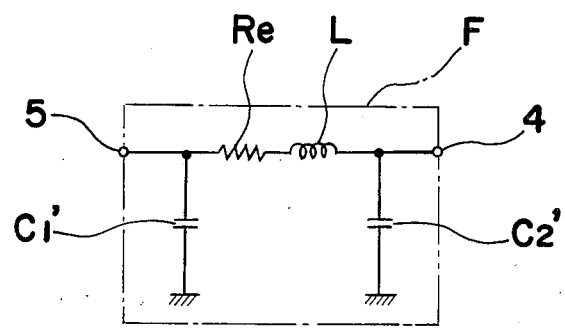

Since the feedback circuit of the present invention includes three electrode type piezoelectric oscillating unit with sections polarized in opposite directions, its equivalent circuit has a similar structure to the circuit constituted by the two electrode type piezoelectric oscillating unit provided with two capacitors shown in FIG. 3.

Furthermore, it is not necessary to provide any phase inversion circuit since the signal at the terminal 12b and the signal at the terminal 12c has the same phase.

Moreover, when a high impedance amplifier is employed, it is not necessary to provide any impedance matching capacitor to the terminals 12b and 12c.

Since no externally connected capacitor is required, the feedback circuit of the present invention oscillates in stable condition with no substantial deviation in the frequency and, requires no adjustment.

In view of the above features, the feedback circuit of the present invention is particularly suitable for use in a oscillator which is incorporated in one chip microcomputer.

Figure 10:
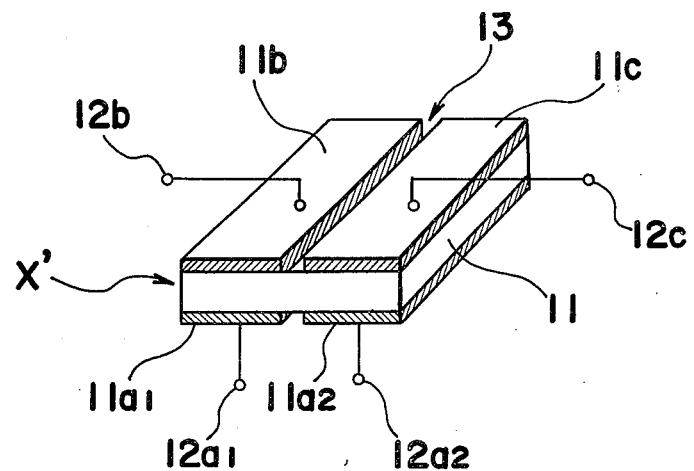
FIG. 10 is a view similar to FIG. 4, but particularly shows a modification thereof.
Figure 11:
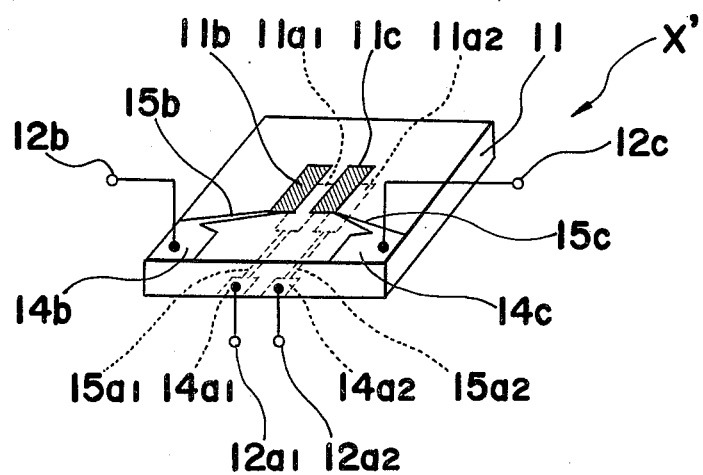
FIG. 11 is a view similar to FIG. 9, but particularly shows a modification thereof.

It is to be noted that the common electrode 11a can be divided into two separate electrodes $11a_1$ and $11a_2$, as shown in FIGS. 10 and 11, which are referred to as counter electrodes instead of common electrode.

Referring to FIG. 10, the counter electrode $11a_1$ and $11a_2$ are connected to terminals $12a_1$ and $12a_2$, respectively. It is apparent to those skilled in the art that the signal produced from the amplifier A is applied across the terminals 12c and $12a_2$ while the signal produced from the piezoelectric oscillating unit x′ across the terminals 12b and $12a_1$ is applied to the input of the amplifier.

Referring to FIG. 11, the connection between the counter electrode $11a_1$ and the terminal $12a_1$ is carried out through a runner electrode $15a_1$ and terminal electrode $14a_1$. Similarly, the connection between the counter electrode $11a_2$ and the terminal $12a_2$ is carried out through a runner electrode $15a_2$ and terminal electrode $14a_2$.

Although the present invention has been fully described by way of examples with reference to the accompanying drawings, it is to be noted that various changes and modifications are apparent to those skilled in the art. For example, the piezoelectric ceramic employed as a body of the oscillating unit can be replaced by any other material which can be polarized. Therefore, such changes and modifications are, unless they depart from the true scope of the present invention, to be understood as included therein.

What is claimed is:

1. An oscillator including an amplifier and a feedback circuit connected between an output and an input of the amplifier, characterized in that said feedback circuit comprises a ceramic piezoelectric oscillating unit comprising: a piezoelectric body having first and second surfaces in face-to-face relation to each other, said piezoelectric body having a first section pre-polarized in one direction between said first and second surfaces and a second section pre-polarized in the opposite direction to said one direction; a first electrode provided on the first surface over the first section of the piezoelectric body; a second electrode provided on the first surface, in spaced relation to the first electrode and over the second section of the piezoelectric body; a first counter electrode means provided on the second surface covering the first section of the piezoelectric body; a second counter electrode means provided on the second surface covering the second section of the piezoelectric body; means coupling an output signal produced at the output of the amplifier across said first electrode and said first counter electrode means; and means coupling an output signal produced across said second electrode and said second counter electrode means to the input of the amplifier.

2. An oscillator as claimed in claim 1, wherein said first and second electrodes are connected to said output and input of the amplifier while said first and second counter electrode means are grounded.

3. An oscillator as claimed in claim 1, wherein said amplifier has a relatively high impedance.

4. An oscillator as claimed in claim 1, wherein said second counter electrode means is positioned in spaced relation to said first counter electrode means.

5. An oscillator as claimed in claim 1, wherein said first and second sections occupy the entire piezoelectric body and are positioned in side-by-side relation to each other.

6. An oscillator as claimed in claim 1, wherein said first section is positioned in the central portion of the piezoelectric body and said second section is positioned in the peripheral portion of the piezoelectric body.

7. An oscillator as claimed in claim 1, wherein said first and second sections are positioned in the central portion of the piezoelectric body in side-by-side relation to each other.

8. An oscillator as claimed in claim 7, wherein said piezoelectric body is an energy trapped type.

9. An oscillator including an amplifier and a feedback circuit connecting between an output and an input of the amplifier, characterized in that said feedback circuit comprises a piezoelectric oscillating unit comprising:

a ceramic piezoelectric body having first and second surfaces in face-to-face relation to each other, said piezoelectric body having a first section pre-polarized in one direction between said first and second surfaces and a second section pre-polarized in the opposite direction to said one direction;

a first electrode provided on said first surface over said first section of said piezoelectric body; a second electrode provided on said first surface, in spaced relation to said first electrode and over said second section of said piezoelectric body; counter electrode provided on said second surface over both the first and second section of said piezoelectric body;

means coupling an output signal produced at the output of said amplifier across said first electrode and said counter electrode; and means coupling an output signal produced across said second electrode and said counter electrode to the input of said amplifier.

10. An oscillator including an amplifier and a feedback circuit connected between an output and an input of the amplifier, characterized in that said feedback circuit comprises a piezoelectric oscillating unit comprising:

a ceramic piezoelectric body having first and second surfaces in face-to-face relation to each other, said piezoelectric body having a first section pre-polarized in one direction between said first and second surfaces and a second section pre-polarized in the opposite direction to said one direction;

a first electrode provided on said first surface over said first section of said piezoelectric body; a second electrode provided on said first surface, in spaced relation to said first electrode and over said second section of the piezoelectric body; a counter electrode provided on said second surface covering both said first and second sections of said piezoelectric body;

first and second terminal electrodes provided on said first surface of said piezoelectric body, said first and second terminal electrodes being connected to said first and second electrodes, respectively, and a third terminal electrode provided on said second surface of said piezoelectric body and positioned out of alignment with said first and second terminal electrodes, said third terminal electrode being connected to said counter electrode through a runner electrode.

* * * * *